(12) United States Patent
Yamaoka et al.

(10) Patent No.: US 7,092,275 B2
(45) Date of Patent: Aug. 15, 2006

(54) MEMORY DEVICE OF FERRO-ELECTRIC

(75) Inventors: Kunisato Yamaoka, Takatsuki (JP); Hiroshige Hirano, Nara (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/019,053

(22) Filed: Dec. 22, 2004

(65) Prior Publication Data
US 2005/0157531 A1    Jul. 21, 2005

(30) Foreign Application Priority Data
Jan. 20, 2004    (JP)    ............................. 2004-011739

(51) Int. Cl.
*G11C 11/22*    (2006.01)
(52) U.S. Cl. .................. 365/145; 365/189.09; 365/210
(58) Field of Classification Search ................ 365/145, 365/189.09, 200, 210
See application file for complete search history.

(56) References Cited

U.S. PATENT DOCUMENTS

| | | |
|---|---|---|
| 5,999,439 A | 12/1999 | Seyyedy |
| 6,028,783 A | 2/2000 | Allen et al. |
| 6,859,380 B1 * | 2/2005 | Ashikaga .................. 365/145 |
| 6,912,149 B1 * | 6/2005 | Yamaoka et al. ........... 365/145 |

OTHER PUBLICATIONS

Chung, Yeonbae, et al., "A 3.3-V 4-Mb Nonvolatile Ferroelectric RAM with a Selectivity-Driven Double-Pulsed Plate Read/Write-Back Scheme", Symposium on VLSI Circuits Digest of Technical Papers, pp. 97-98, 1999.

\* cited by examiner

*Primary Examiner*—Richard Elms
*Assistant Examiner*—Hien Nguyen
(74) *Attorney, Agent, or Firm*—McDermott Will & Emery LLP

(57) ABSTRACT

In a ferro-electric memory including reference cells, if one reference cell is associated with a plurality of normal cells, a period in which "L" data is written in the reference cell and a period in which "H" data is written or read out in/from the reference cell are controlled to be shorter than a period in which "L" data is written in each normal cell and a period in which "H" data is written or read out in/from each normal cell, respectively. In this manner, stress applied to the reference cell is reduced and, even if writing or reading is repeatedly performed on the normal cells, the reliability of the reference cell is enhanced and deterioration in characteristics of the reference cell due to repetitive rewriting of data is suppressed.

9 Claims, 10 Drawing Sheets

MEMORY DEVICE OF FERRO-ELECTRIC

CROSS-REFERENCE TO RELATED APPLICATION

This Non-provisional application claims priority under 35 U.S.C. §119(a) on Patent Application No. 2004-11739 filed in Japan on Jan. 20, 2004, the entire contents of which are hereby incorporated by reference.

BACKGROUND OF THE INVENTION

The present invention relates to memory devices of ferro-electric including normal cells and reference cells and particularly relates to a technique for achieving high reliability by reducing stress on reference cells.

In recent years, with miniaturization in processing and increase in capacity, memory cells containing one transistor and one ferro-electric capacitor (1T1C) capable of reducing the memory cell size have been replacing currently-used memory cells containing two transistors and two ferro-electric capacitors (2T2C) to form ferro-electric memories. The 1T1C memory cells need reference cells in addition to the configuration of normal 2T2C memory cells. Therefore, to increase the speed and enhance the reliability, it has become more and more important to shorten the period necessary for writing or reading data in/from reference cells.

Hereinafter, a conventional ferro-electric memory will be described with reference to drawings. The following technique for this conventional memory is shown in U.S. Pat. No. 6,028,078 or Yaonbae Chung et al., "A 3.3-V 4-Mb Nonvolatile Ferroelectric RAM with a Selectively-Driven Double-Pulsed Plate Read/Write-Back Scheme"; Symposium on VLSI Circuits Digest of Technical Papers, 1999, pp. 97–98.

FIG. 7 is a diagram showing hysteresis characteristics of a ferro-electric for use in memory cell capacitors in a ferro-electric memory. FIG. 8 is a timing chart showing operation in the conventional ferro-electric memory. FIG. 9 is a diagram showing a detailed circuit configuration of the conventional ferro-electric memory. FIG. 10 is a diagram schematically showing the circuit configuration of the conventional ferro-electric memory.

In FIGS. 9 and 10, reference sign RMC0 denotes a first reference cell for writing and reading data. The first reference cell RMC0 includes: a first MOS transistor T0 whose drain is connected to a first reference bit line BL0 and gate is connected to a reference word line RWL; and a first ferro-electric capacitor C0 whose one end is connected to the source of the first MOS transistor T0 at a connection point, i.e., a first storage node ST0, and the other end is connected to a reference cell plate line RCP.

Reference sign RMC1 denotes a second reference cell for writing and reading data. The second reference cell RMC1 includes: a second MOS transistor T1 whose drain is connected to a third reference bit line BL2 and gate is connected to the reference word line RWL; and a second ferro-electric capacitor C1 whose one end is connected to the source of the second MOS transistor T1 at a connection point, i.e., a second storage node ST1, and the other end is connected to the reference cell plate line RCP.

Reference sign RMC2 denotes a third reference cell for writing and reading data. The third reference cell RMC2 includes: an eleventh MOS transistor T10 whose drain is connected to a fifth reference bit line BL4 and gate is connected to the reference word line RWL; and a fifth ferro-electric capacitor C4 whose one end is connected to the source of the eleventh MOS transistor T10 at a connection point, i.e., a fifth storage node ST4, and the other end is connected to the reference cell plate line RCP.

Reference sign RMC3 denotes a fourth reference cell for writing and reading data. The fourth reference cell RMC3 includes: a twelfth MOS transistor T11 whose drain is connected to a seventh reference bit line BL6 and gate is connected to the reference word line RWL; and a sixth ferro-electric capacitor C5 whose one end is connected to the source of the twelfth MOS transistor T11 at a connection point, i.e., a sixth storage node ST5, and the other end is connected to the reference cell plate line RCP.

In FIGS. 9 and 10, reference signs MC0, MC1, MC2, MC3, MC0n, MC1n, MC2n and MC3n denote normal cells. The reference sign MC0 denotes a first memory cell for writing and reading data. The first memory cell MC0 includes: a ninth MOS transistor T8 whose drain is connected to a second normal bit line BL1 and gate is connected to a word line WL; and a third ferro-electric capacitor C2 whose one end is connected to the ninth MOS transistor T8 and the other end is connected to a cell plate line CP.

The reference sign MC1 denotes a second memory cell for writing and reading data. The second memory cell MC1 includes: a tenth MOS transistor T9 whose drain is connected to a fourth normal bit line BL3 and gate is connected to the word line WL; and a fourth ferro-electric capacitor C3 whose one end is connected to the tenth MOS transistor T9 and the other end is connected to the cell plate line CP.

The reference sign MC2 denotes a third memory cell for writing and reading data. The third memory cell MC2 includes: a nineteenth MOS transistor T18 whose drain is connected to a sixth normal bit line BL5 and gate is connected to the word line WL; and a seventh ferro-electric capacitor C6 whose one end is connected to the nineteenth MOS transistor T18 and the other end is connected to the cell plate line CP.

The reference sign MC3 denotes a fourth memory cell for writing and reading data. The fourth memory cell MC3 includes: a twentieth MOS transistor T19 whose drain is connected to an eighth normal bit line BL7 and gate is connected to the word line WL; and an eighth ferro-electric capacitor C7 whose one end is connected to the twentieth MOS transistor T19 and the other end is connected to the cell plate line CP.

The normal cells MC0n through MC3n have the same configurations as those of the normal cells MC0 through MC3, and thus detailed description thereof will be omitted.

The normal cells MC0n through MC3n are arranged in rows (i.e., direction along the word line) and columns (i.e., direction along bit lines). Between two normal cells (e.g., MC0 and MC0n) arranged in the same column, one or more other normal cells (not shown) are placed. The reference cell RMC0 is associated with a plurality of normal cells MC0 through MC0n arranged in the same column as the reference cell RMC0. In the same manner, the reference cell RMC1 is associated with a plurality of normal cells MC1 through MC1n arranged in the same column as the reference cell RMC1. The reference cell RMC2 is associated with a plurality of normal cells MC2 through MC2n. The reference cell RMC3 is associated with a plurality of normal cells MC3 through MC3n.

In addition, in FIGS. 9 and 10, reference sign RST0 denotes a first reference cell resetting circuit. The first reference cell resetting circuit RST0 includes: a third MOS transistor T2 whose gate is connected to a reference-cell-reset starting signal line RST and source is connected to the first storage node ST0 of the first reference cell RMC0; and a fourth MOS transistor T3 whose gate is connected to the reference-cell-reset starting signal line RST, source is grounded and drain is connected to the second storage node ST1 of the second reference cell RMC1.

Reference sign RST1 denotes a second reference cell resetting circuit. The second reference cell resetting circuit RST1 includes: a thirteenth MOS transistor T12 whose gate is connected to the reference-cell-reset starting signal line RST and source is connected to the fifth storage node ST4 of the third reference cell RMC2; and a fourteenth MOS transistor T13 whose gate is connected to the reference-cell-reset starting signal line RST, source is grounded and drain is connected to the sixth storage node ST5 of the fourth reference cell RMC3.

Reference sign RFDR0 denotes a first reference cell reset driver. The first reference cell reset driver RFDR0 includes: a fifth MOS transistor T4 whose gate is connected to a second reference-cell-reset-driver starting signal line XRDIN3 and source receives a power-supply potential; a sixth MOS transistor T5 whose gate is connected to a first reference-cell-reset-driver starting signal line XRDIN2 and source is grounded; and a seventh MOS transistor T6 whose gate is connected to a third reference-cell-reset-driver starting signal line RDIN4 and source is grounded. The drains of these three MOS transistors are connected to the source of the third MOS transistor T2 included in the first reference cell resetting circuit RST0.

Reference sign RFDR1 denotes a second reference cell reset driver. The second reference cell reset driver RFDR1 includes: a fifteenth MOS transistor T14 whose gate is connected to the second reference-cell-reset-driver starting signal line XRDIN3 and source receives a power-supply potential; a sixteenth MOS transistor T15 whose gate is connected to the first reference-cell-reset-driver starting signal line XRDIN2 and source is grounded; and a seventeenth MOS transistor T16 whose gate is connected to the third reference-cell-reset-driver starting signal line RDIN4 and source is grounded. The drains of these three MOS transistors are connected to the source of the thirteenth MOS transistor T12 included in the second reference cell resetting circuit RST1.

Reference sign T7 denotes an eighth MOS transistor whose drain and source connect the first reference bit line BL0 and the third reference bit line BL2 to each other and gate is connected to a reference-level-equalization starting signal line REQ. Reference sign T17 denotes an eighteenth MOS transistor whose drain and source connect the fifth reference bit line BL4 and the seventh reference bit line BL6 to each other and gate is connected to the reference-level-equalization starting signal line REQ.

Reference sign SA denotes a sense amplifier for amplifying the potential difference between the first reference bit line BL0 and the second normal bit line BL1, the potential difference between the third reference bit line BL2 and the fourth normal bit line BL3, the potential difference between the fifth reference bit line BL4 and the sixth normal bit line BL5 and the potential difference between the seventh reference bit line BL6 and the eighth normal bit line BL7, when a sense amplifier starting signal SAE is at an H level.

Reference sign PERI0 denotes a first peripheral circuit connected to the reference word line RWL, the word line WL, the reference cell plate line RCP, the cell plate line CP, the reference-cell-reset starting signal line RST, the reference-level-equalization starting signal line REQ, the first reference-cell-reset-driver starting signal line XRDIN2, the second reference-cell-reset-driver starting signal line XRDIN3, and the third reference-cell-reset-driver starting signal line RDIN4 and the sense amplifier starting signal line SAE. The first peripheral circuit PERI0 controls the reference cells RMC0 through RMC3, the reference cell resetting circuits RST0 and RST1, the reference cell reset drivers RFDR0 and RFDR1, the memory cells MC0 through MC3, the sense amplifier SA and the MOS transistors T7 and T17.

Circuit operation of this conventional ferro-electric memory will be described with reference to the timing chart of FIG. 8 and the diagram of FIG. 7 showing hysteresis characteristics of a ferro-electric constituting the ferro-electric capacitors C0 through C7 of memory cells in the ferro-electric memory.

In FIG. 7, the abscissa indicates a voltage applied to a ferro-electric capacitor, more specifically, a voltage applied to a plate line relative to a bit-line voltage. The ordinate indicates the amount of charge in the ferro-electric capacitors upon the application of the voltage. As shown in FIG. 7, in the ferro-electric capacitors, residual polarization occurs as indicated by points A and G even when a voltage applied between both terminals is zero. A nonvolatile ferro-electric memory for storing data is implemented by utilizing this residual polarization characteristic. When data in a memory cell is "1", a memory cell capacitor is in the state indicated by point A in FIG. 7. When data in the memory cell is "0", the memory cell capacitor is in the state indicated by point G in FIG. 7.

Suppose the first ferro-electric capacitor C0 and the second ferro-electric capacitor C1 in FIG. 9 are included in the reference cells RMC0 and RMC1, the third ferro-electric capacitor C2 and the fourth ferro-electric capacitor C3 are included in the normal memory cells MC0 and MC1. Then, if data is read out from the third and fourth ferro-electric capacitors C2 and C3 with data "1" written in the first and third ferro-electric capacitors C0 and C2 and data "0" written in the second and fourth ferro-electric capacitors C1 and C3, the word line WL, the cell plate line CP, the reference-level-equalization starting signal REQ, the reference word line RWL, the reference cell plate line RCP, the sense amplifier starting signal SAE, the first reference bit line BL0, the second normal bit line BL1, the third reference bit line BL2, the fourth normal bit line BL3, the reference-cell-reset starting signal RST, the third reference-cell-reset-driver starting signal RDIN4, the first storage node ST0 and the second storage node ST1 are at logic voltage levels "L", and the first reference-cell-reset-driver starting signal XRDIN2 and the second reference-cell-reset-driver starting signal XRDIN3 are at logic voltage levels "H", as an initial state.

First, at timing t01 shown in FIG. 8, the reference-level-equalization starting signal REQ is raised to a logic voltage level "H". At timing t02, the word line WL and the reference word line RWL are raised to logic voltage levels "H". At timing t03, the cell plate line CP and the reference cell plate line RCP are raised to logic voltage levels "H".

In this manner, the first MOS transistor T0, the second MOS transistor T1, the ninth MOS transistor T8 and the tenth MOS transistor T9 in FIG. 9 are turned ON, so that a voltage is applied to the first ferro-electric capacitor C0, the second ferro-electric capacitor C1, the third ferro-electric capacitor C2 and the fourth ferro-electric capacitor C3. In addition, the eighth MOS transistor T7 is turned ON, thereby making the first reference bit line BL0 and the third reference bit line BL2 electrically continuous. At this time, data "1" is written in the third ferro-electric capacitor C2, so that the state indicated by point A changes to the state indicated by point B as shown in FIG. 7, and charge Q1 is read out to the second normal bit line BL1. Data "0" is written in the fourth ferro-electric capacitor C3, so that the state indicated by point G changes to the state indicated by point E as shown in FIG. 7. Accordingly, charge Q0 is read out to the fourth normal bit line BL3. On the other hand, data "1" is written in the first ferro-electric capacitor C0, so that the state indicated by point A changes to the state indicated by point C as shown in FIG. 7. Data "0" is written in the second ferro-electric capacitor C1, so that the state indicated by point G changes to the state indicated by point F as shown in FIG. 7. Accordingly, charge QR is read out to the first and third reference bit lines BL0 and BL2.

Then, at timing t05 shown in FIG. 8, the reference cell plate line RCP and the cell plate line CP are lowered to logic voltage levels "L". At this time, the third ferro-electric capacitor C2 changes from the state indicated by point B to the state indicated by point J as shown in FIG. 7. The fourth ferro-electric capacitor C3 changes from the state indicated by point E to the state indicated by point G as shown in FIG. 7. The first ferro-electric capacitor C0 changes from the state indicated by point C to the state indicated by point K as shown in FIG. 7. The second ferro-electric capacitor C1 changes from the state indicated by point F to the state indicated by point H as shown in FIG. 7.

Thereafter, at timing t06 shown in FIG. 8, the reference word line RWL is lowered to a logic voltage level "L". Then, the first ferro-electric capacitor C0 changes from the state indicated by point K to the state indicated by point L as shown in FIG. 7 and the second ferro-electric capacitor C1 changes from the state indicated by point H to the state indicated by point P as shown in FIG. 7.

Subsequently, at timing t09 shown in FIG. 8, the sense amplifier starting signal SAE is raised to a logic voltage level "H". The sense amplifier SA amplifies a potential difference (potential difference V1 shown in FIG. 7) read out to the first reference bit line BL0 and the second normal bit line BL1 and a potential difference (potential difference V0 shown in FIG. 7) read out to the third reference bit line BL2 and the fourth normal bit line BL3, so that data "1" is read out from the third ferro-electric capacitor C2 and data "0" is read out from the fourth ferro-electric capacitor C3. At this time, the third ferro-electric capacitor C2 changes from the state indicated by point J to the state indicated by point I as shown in FIG. 7. The fourth ferro-electric capacitor C3 remains in the state indicated by point G shown in FIG. 7.

On the other hand, at timing t07 shown in FIG. 8, the reference-level-equalization starting signal REQ is lowered to a logic voltage level "L". At timing t09, the first reference-cell-reset-driver starting signal XRDIN2 is lowered to a logic voltage level "L", the second reference-cell-reset-driver starting signal XRDIN3 is lowered to a logic voltage level "L", and reference-cell-reset starting signal RST is raised to a logic voltage level "H". Then, the first ferro-electric capacitor C0 changes from the state indicated by point L to the state indicated by point I by way of the state indicated by point K as shown in FIG. 7. The second ferro-electric capacitor C1 remains in the state indcted by point P shown in FIG. 7.

At timing t10 shown in FIG. 8, the cell plate line CP and the reference cell plate line RCP are raised to logic voltage levels "H". Then, the first and third ferro-electric capacitors C0 and C2 change from the state indicated by point I to the state indicated by point A as shown in FIG. 7. The second and fourth ferro-electric capacitors C1 and C3 change from the state indicated by point G to the state indicated by point D as shown in FIG. 7.

Thereafter, at timing t12 shown in FIG. 8, the reference cell plate line RCP and the cell plate line CP are lowered to logic voltage levels "L". Then, the first and third ferro-electric capacitors C0 and C2 change from the state indicated by point A to the state indicated by point I as shown in FIG. 7. The second and fourth ferro-electric capacitors C1 and C3 change from the state indicated by point D to the state indicated by point G as shown in FIG. 7.

Then, at timing t14 shown in FIG. 8, the sense amplifier starting signal SAE is lowered to a logic voltage level "L". Then, the third ferro-electric capacitor C2 changes from the state indicated by point I to the state indicated by point A as shown in FIG. 7. The fourth ferro-electric capacitor C3 remains in the state indicated by point G shown in FIG. 7.

In addition, at timing t14 shown in FIG. 8, the second reference-cell-reset-driver starting signal XRDIN3 is raised to a logic voltage level "H" so that the fifth MOS transistor T4 is turned OFF. The third reference-cell-reset-driver starting signal RDIN4 is raised to a logic voltage level "H" so that the seventh MOS transistor T6 is turned ON. Then, at timing t15 shown in FIG. 8, the first reference-cell-reset-driver starting signal XRDIN2 is raised to a logic voltage level "H" so that the sixth MOS transistor T5 is turned ON. The third reference-cell-reset-driver starting signal RDIN4 is lowered to a logic voltage level "L" so that the seventh MOS transistor T6 is turned OFF. Then, the first ferro-electric capacitor C0 changes from the state indicated by point I to the state indicated by point A as shown in FIG. 7 and the second ferro-electric capacitor C1 remains in the state indicated by point G shown in FIG. 7.

Lastly, at timing t17 shown in FIG. 8, the word line WL and the reference-cell-reset starting signal RST are lowered to logic voltage levels "L". At this time, the first and third ferro-electric capacitors C0 and C2 are in the state indicated by point A shown in FIG. 7, and the second and fourth ferro-electric capacitors C1 and C3 are in the state indicated by point G shown in FIG. 7.

As described above, in the conventional ferro-electric memory, the period (period (4) in FIG. 8) in which "L" data is written in the reference cells RMC0 through RMC3 is equal to the period (period (1) in FIG. 8) in which "L" data is written in the normal cells MC0 through MC3n. In addition, the period (period (5) in FIG. 8) in which "H" data is written in the reference cells is equal to the period (period (2) in FIG. 8) in which "H" data is written in the normal cells. Moreover, the period (period (6) in FIG. 8) in which data is read out from the reference cells is equal to the period (period (3) in FIG. 8) in which data is read out from the normal cells.

However, in a ferro-electric memory including reference cells, if one reference cell RMC0 is associated with a large number of normal cells (e.g., MC0 through MC0n) in the same row, the reference cell RMC0 is accessed concurrently with every access to the normal cells MC0 through MC0n. Accordingly, since the writing period and the reading period for the normal cells MC0 through MC0n are respectively equal to those for the reference cell RMC0, the reference cell RMC0 is subjected to stress N times (where N is the number of normal cells) as high as that on a normal cell (e.g., MC0). As a result, characteristics such as a characteristic in rewriting data in the reference cell RMC0, which is accessed more frequently than each of the normal cells MC0 through MC0n, deteriorate as compared to characteristics of the normal cells MC0 through MC0n.

SUMMARY OF THE INVENTION

It is therefore an object of the present invention to provide highly-reliable ferro-electric memory by reducing total stress on a reference cell associated with a plurality of normal cells.

In order to achieve this object, according to the present invention, in a case where one reference cell is associated with a plurality of normal cell, the writing or reading period for a reference cell is set shorter than that for each of the normal cells, so that total stress on the reference cell is reduced. As a result, high reliability is achieved and the speed is increased.

Specifically, a ferro-electric memory according to the present invention includes: at least one reference cell; a plurality of normal cells associated with the reference cell; and a control circuit for controlling access to the normal cells and the reference cell. With respect to at least one pair out of three pairs of processing periods including a pair of a period in which "H" data is written in the reference cell and a period in which "H" data is written in each of the normal cells, a pair of a period in which "L" data is written in the reference cell and a period in which "L" data is written in each of the normal cells, and a pair of a period in which data is read out from the reference cell and a period in which data is read out from each of the normal cells, the control circuit sets a processing period for the reference cell to be shorter than a processing period for each of the normal cells.

In one embodiment of the present invention, the ferro-electric memory includes: a normal bit line through which data is read out from one of the normal cells; a reference bit line through which data is read out from the reference cell; and a sense amplifier for amplifying a potential difference between the normal bit line and the reference bit line, wherein the control circuit sets the period in which "H" data or "L" data is written in the reference cell to be longer than a period necessary for the potential difference between the normal bit line and the reference bit line to be sensed by the sense amplifier when "H" data or "L" data is read out from the normal cells and the reference cell.

In another embodiment, the ferro-electric memory includes: a normal bit line through which data is read out from one of the normal cells; a reference bit line through which data is read out from the reference cell; and a sense amplifier for amplifying a potential difference between the normal bit line and the reference bit line, wherein the control circuit sets the period in which data is read out from the reference cell to be longer than a period necessary for the potential difference between the normal bit line and the reference bit line to be sensed by the sense amplifier when "H" data or "L" data is read out from the normal cells and the reference cell.

In yet another embodiment, in the ferro-electric memory, the control circuit sets the period in which "H" data is written in the reference cell to be shorter than the period in which "H" data is written in each of the normal cells.

In still another embodiment, in the ferro-electric memory, the control circuit sets the period in which "H" data is written in the reference cell to be shorter than the period in which "L" data is written in the reference cell.

In another embodiment, the ferro-electric memory, control circuit sets the period in which "L" data is written in the reference cell to be shorter than the period in which "L" data is written in each of the normal cells.

In another embodiment, in the ferro-electric memory, the control circuit sets the period in which "L" data is written in the reference cell to be shorter than the period in which "H" data is written in the reference cell.

In another embodiment, in the ferro-electric memory, the control circuit sets the period in which data is read out from the reference cell to be shorter than the period in which data is read out from each of the normal cells.

In another embodiment, the ferro-electric memory includes: a normal bit line through which data is read out from one of the normal cells; a reference bit line through which data is read out from the reference cell; and a sense amplifier for amplifying a potential difference between the normal bit line and the reference bit line, wherein the control circuit sets the period in which data is read out from the reference cell to be longer than a period necessary for the potential difference between the normal bit line and the reference bit line to be sensed by the sense amplifier when "H" data or "L" data is read out from the normal cells and the reference cell.

As described above, in the ferro-electric memory according to the present invention, if one reference cell is associated with a plurality of normal cells, the control circuit sets at least one of a period in which "H" data is written in the reference cell, a period in which "L" data is written in the reference cell and a period in which data is read out from the reference cell, to be shorter than a period in which "H" data is written in each of the normal cells, a period in which "L" data is written in each of the normal cells and a period in which data is read out from each of the normal cells, respectively. As a result, even if data is repeatedly written or read out in/from the normal cells, total stress on the reference cell is largely reduced though writing or reading is performed on the reference cell the same number of times as the normal cells. This is because data is written or read out in/from the reference cell in a short period at one access, so that total stress on the reference cell is reduced accordingly.

DESCRIPTION OF THE PREFERRED EMBODIMENTS

Hereinafter, preferred embodiments of the present invention will be described with reference to the accompanying drawings.

Embodiment 1

Hereinafter, a first embodiment of the present invention will be described with reference to drawings.

Figure 2:
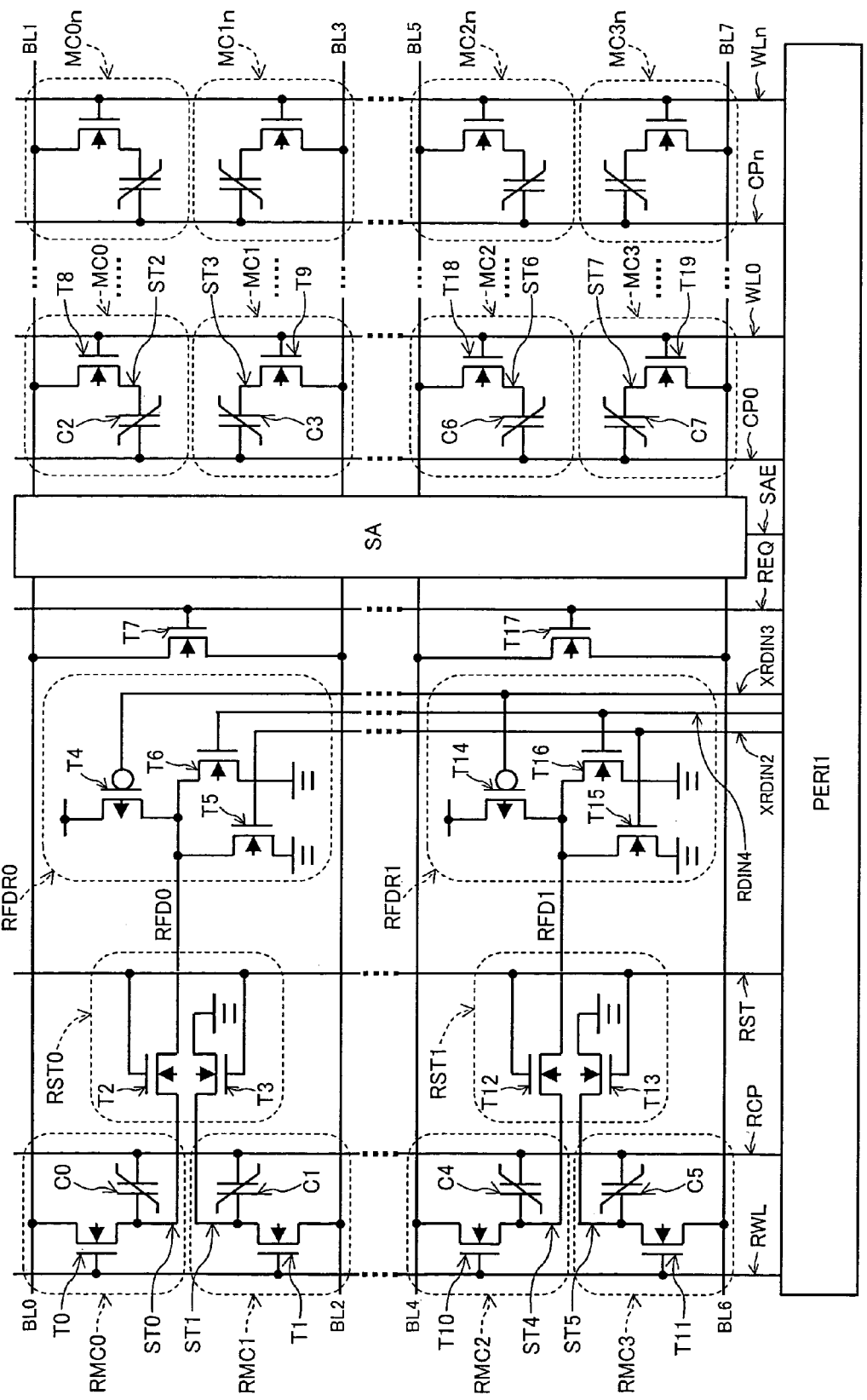
FIG. 2 is a diagram showing a detailed circuit configuration of a ferro-electric memory according to a first embodiment of the present invention.
Figure 3:
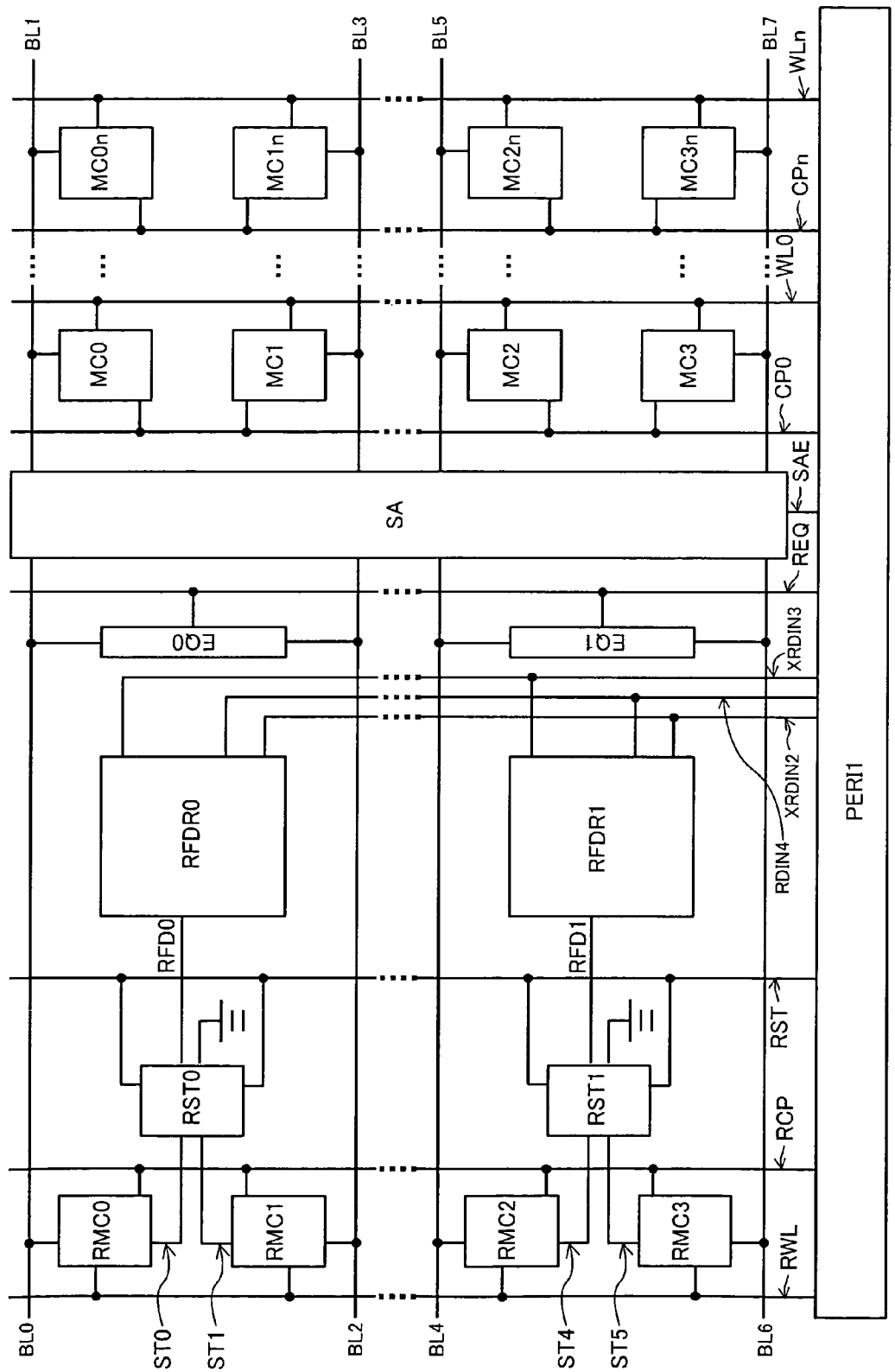
FIG. 3 is a diagram schematically showing the circuit configuration of the ferro-electric memory of the first embodiment.
Figure 4:
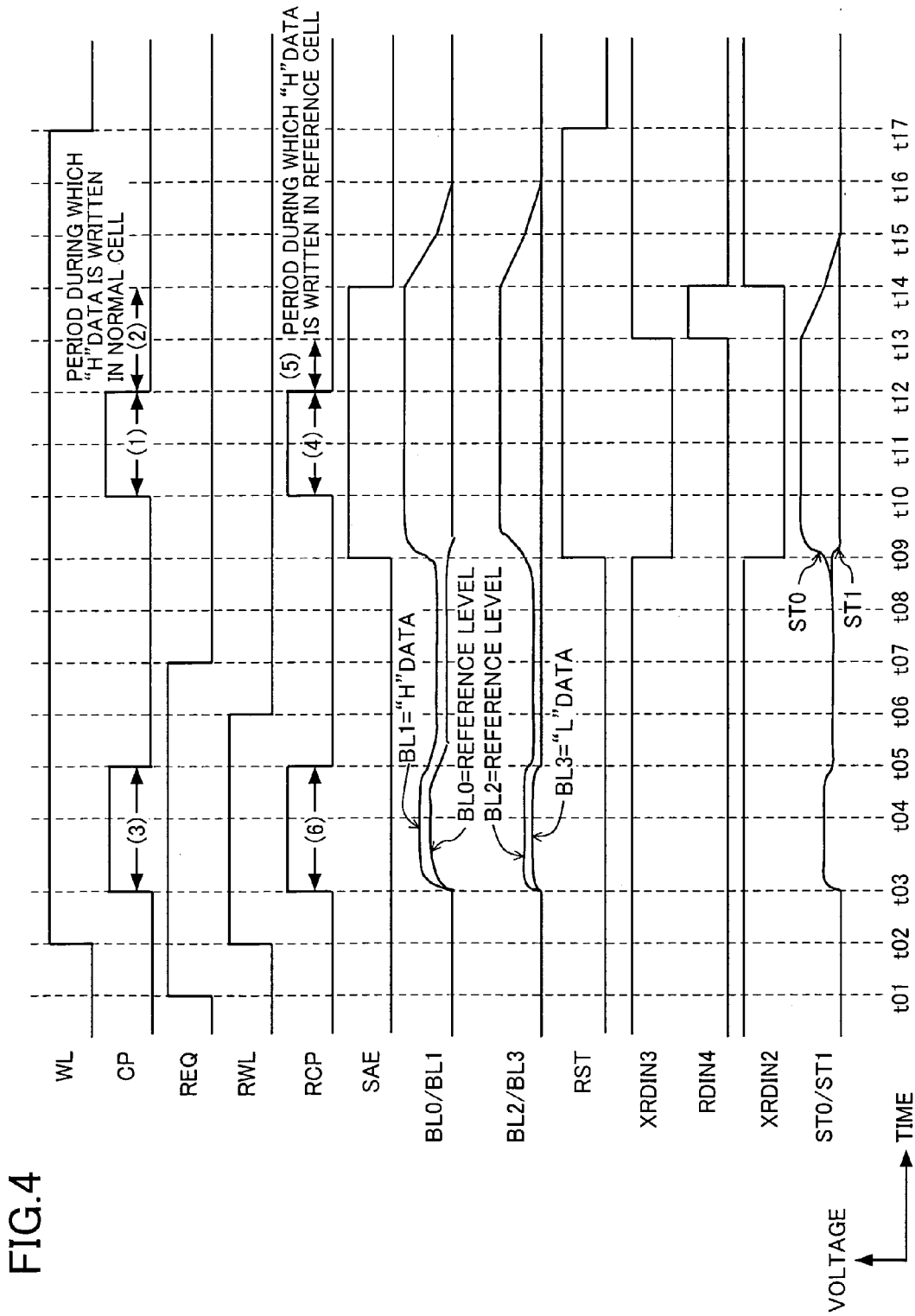
FIG. 4 is a timing chart showing operation of the ferro-electric memory of the first embodiment.
Figure 7:
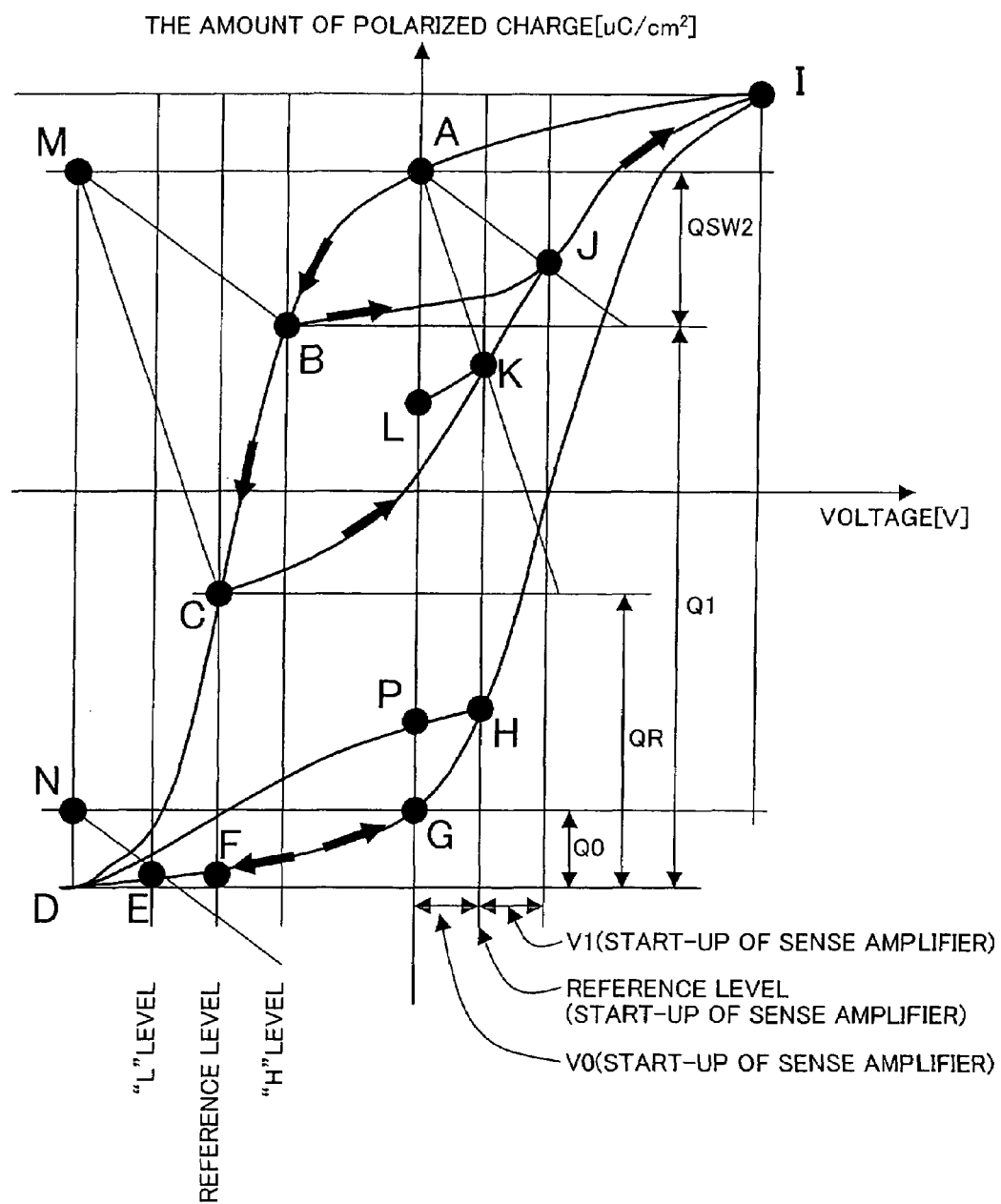
FIG. 7 is a diagram showing hysteresis characteristics of a ferro-electric used in a memory cell capacitor in a ferro-electric memory.
Figure 8:
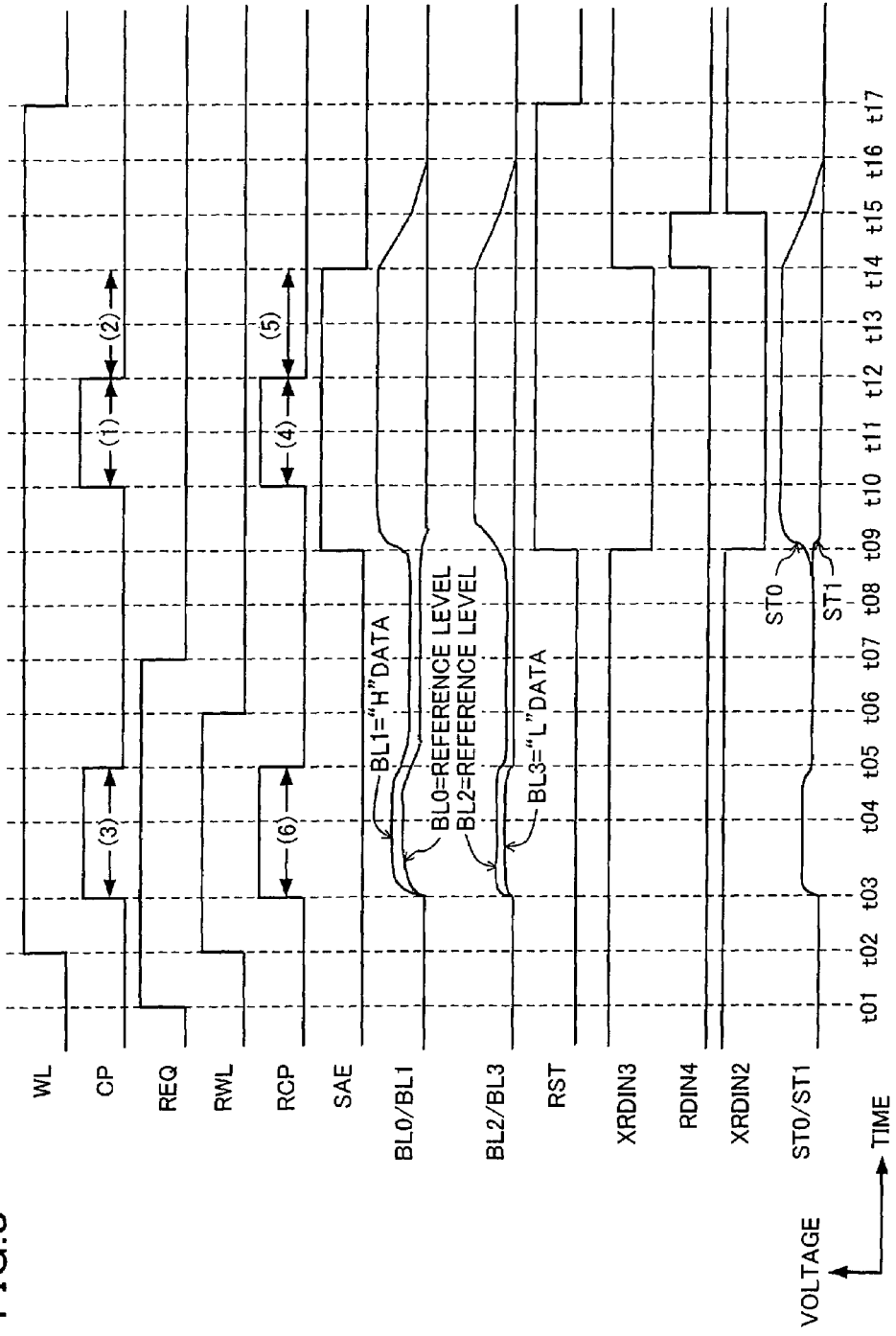
FIG. 8 is a timing chart showing operation of a conventional ferro-electric memory.
Figure 9:
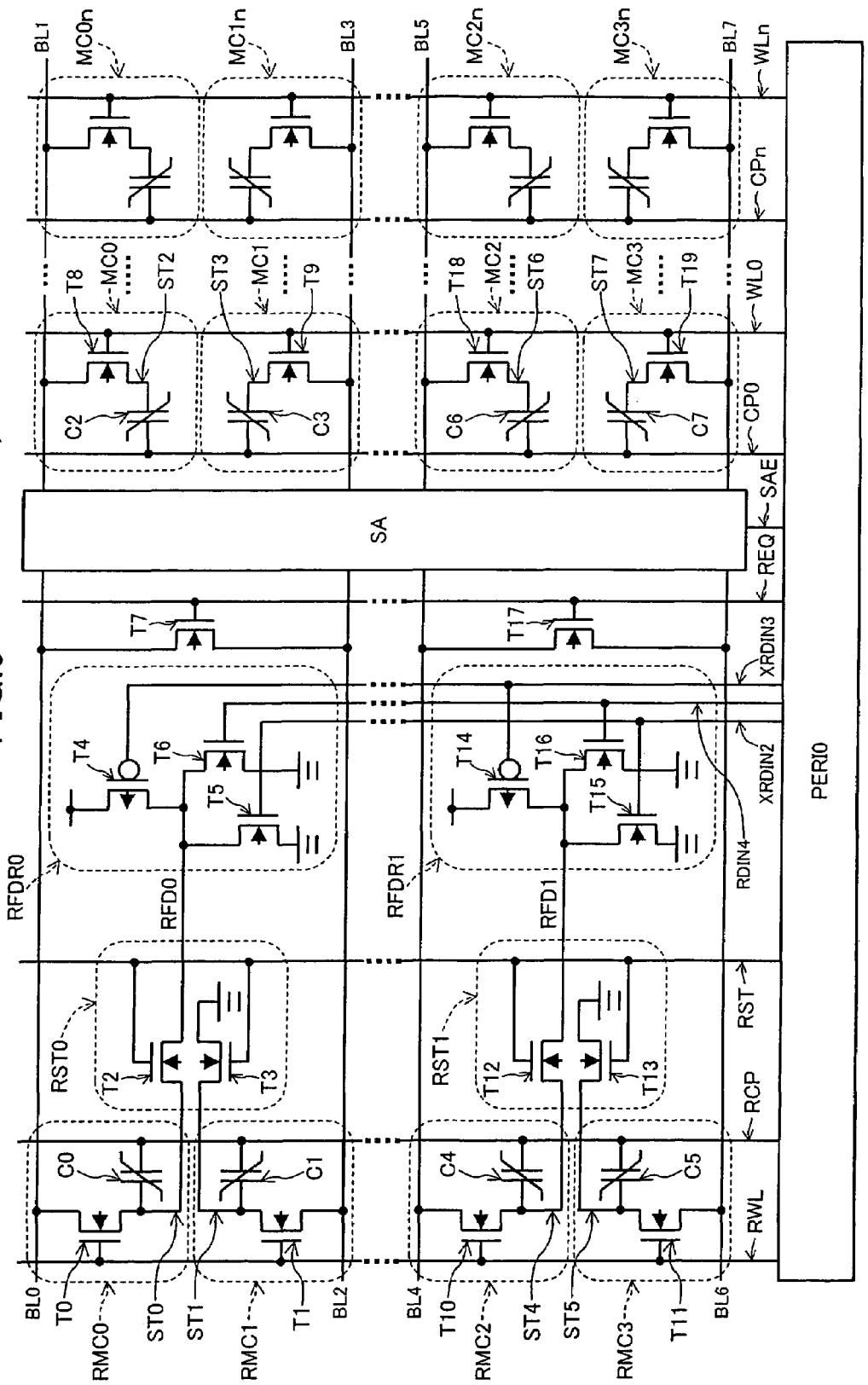
FIG. 9 is a diagram showing a detailed circuit configuration of the conventional ferro-electric memory.
Figure 10:
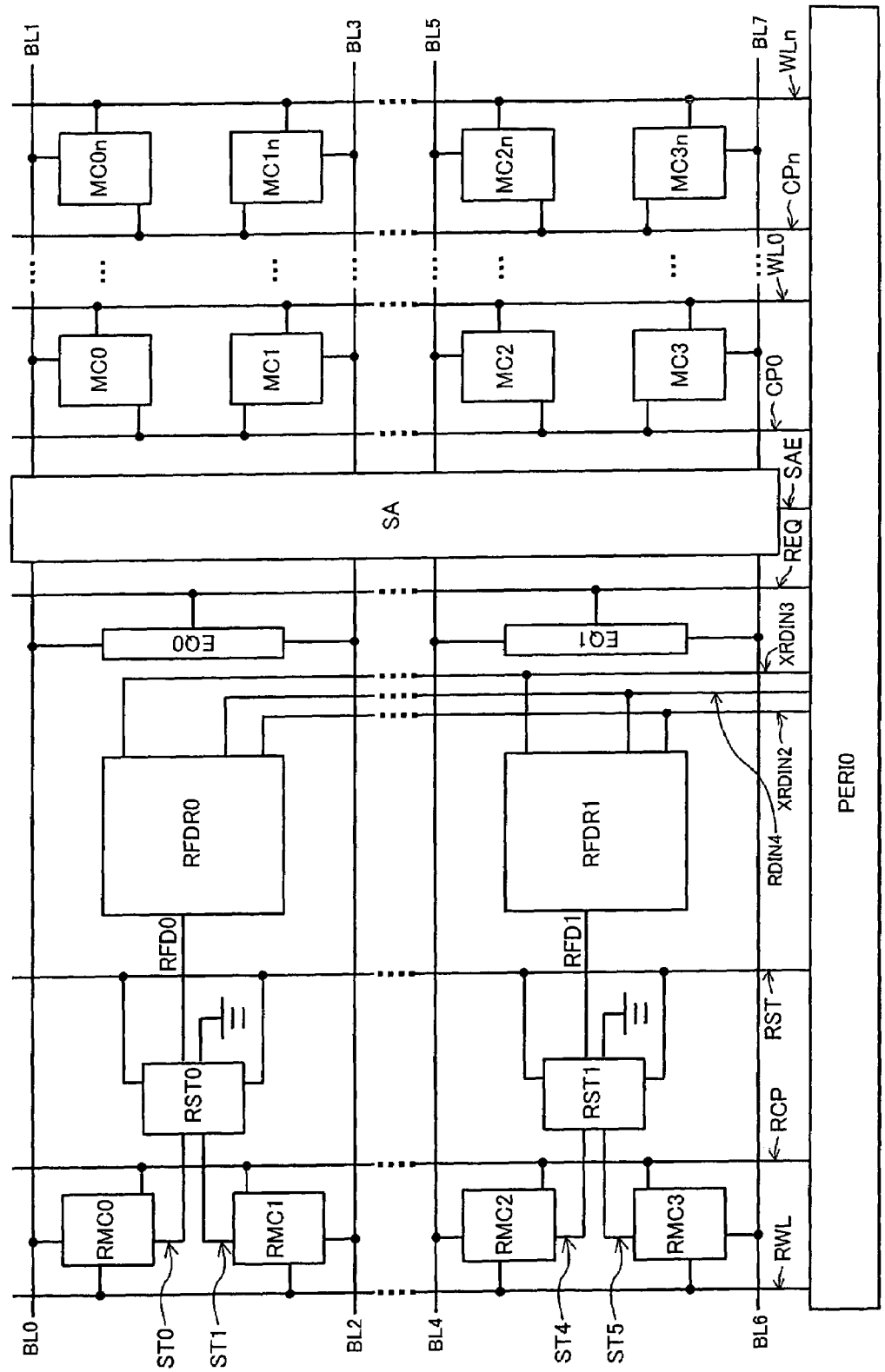
FIG. 10 is a diagram schematically showing the circuit configuration of the conventional ferro-electric memory.

FIG. 2 is a diagram showing a detailed circuit configuration of a ferro-electric memory according to the first embodiment. FIG. 3 is a diagram schematically showing the circuit configuration of the ferro-electric memory of the first embodiment. FIG. 4 is a timing chart showing operation of the ferro-electric memory of the first embodiment. FIG. 7 is a diagram showing hysteresis characteristics of a ferro-electric for use in memory cell capacitors in a ferro-electric memory. This embodiment will be described with reference to FIGS. 2, 3, 4 and 7.

In FIGS. 2 and 3, reference signs RMC0, RMC1, RMC2 and RMC3 denote reference cells. The reference sign RMC0 denotes a first reference cell for writing and reading data. The first reference cell RMC0 includes: a first MOS transistor T0 whose drain is connected to a first reference bit line BL0 and gate is connected to a reference word line RWL; and a first ferro-electric capacitor C0 whose one end is connected to the source of the first MOS transistor T0 at a connection point, i.e., a first storage node ST0, and the other end is connected to a reference cell plate line RCP.

Reference sign RMC1 denotes a second reference cell for writing and reading data. The second reference cell RMC1 includes: a second MOS transistor T1 whose drain is connected to a third reference bit line BL2 and gate is connected to the reference word line RWL; and a second ferro-electric capacitor C1 whose one end is connected to the source of the second MOS transistor T1 at a connection point, i.e., a second storage node ST1, and the other end is connected to the reference cell plate line RCP.

Reference sign RMC2 denotes a third reference cell for writing and reading data. The third reference cell RMC2 includes: an eleventh MOS transistor T10 whose drain is connected to a fifth reference bit line BL4 and gate is connected to the reference word line RWL; and a fifth ferro-electric capacitor C4 whose one end is connected to the source of the eleventh MOS transistor T10 at a connection point, i.e., a fifth storage node ST4, and the other end is connected to the reference cell plate line RCP.

Reference sign RMC3 denotes a fourth reference cell for writing and reading data. The fourth reference cell RMC3 includes: a twelfth MOS transistor T11 whose drain is connected to a seventh reference bit line BL6 and gate is connected to the reference word line RWL; and a sixth ferro-electric capacitor C5 whose one end is connected to the source of the twelfth MOS transistor T11 at a connection point, i.e., a sixth storage node ST5, and the other end is connected to the reference cell plate line RCP.

In FIGS. 2 and 3, reference signs MC0, MC1, MC2, MC3, MC0n, MC1n, MC2n and MC3n denote normal cells. The reference sign MC0 denotes a first memory cell for writing and reading data. The first memory cell MC0 includes: a ninth MOS transistor T8 whose drain is connected to a second normal bit line BL1 and gate is connected to a word line WL; and a third ferro-electric capacitor C2 whose one end is connected to the ninth MOS transistor T8 and the other end is connected to a cell plate line CP.

The reference sign MC1 denotes a second memory cell (normal cell) for writing and reading data. The second memory cell MC1 includes: a tenth MOS transistor T9 whose drain is connected to a fourth normal bit line BL3 and gate is connected to the word line WL; and a fourth ferro-electric capacitor C3 whose one end is connected to the tenth MOS transistor T9 and the other end is connected to the cell plate line CP.

The reference sign MC2 denotes a third memory cell for writing and reading data. The third memory cell MC2 includes: a nineteenth MOS transistor T18 whose drain is connected to a sixth normal bit line BL5 and gate is connected to the word line WL; and a seventh ferro-electric capacitor C6 whose one end is connected to the nineteenth MOS transistor T18 and the other end is connected to the cell plate line CP.

The reference sign MC3 denotes a fourth memory cell for writing and reading data. The fourth memory cell MC3 includes: a twentieth MOS transistor T19 whose drain is connected to an eighth normal bit line BL7 and gate is connected to the word line WL; and an eighth ferro-electric capacitor C7 whose one end is connected to the twentieth MOS transistor T19 and the other end is connected to the cell plate line CP.

The normal cells MC0n through MC3n have the same configurations as those of the normal cells MC0 through MC3, and thus detailed description thereof will be omitted.

The normal cells MC0n through MC3n are arranged in rows (i.e., direction along word lines) and columns (i.e., direction along bit lines). Between two normal cells (e.g., MC0 and MC0n) arranged in the same column, one or more other normal cells (not shown) are placed. The reference cell RMC0 is associated with a plurality of memory cells MC0 through MC0n arranged in the same column as the reference cell RMC0. In the same manner, the reference cell RMC1 is associated with a plurality of memory cells MC1 through MC1n arranged in the same column as the reference cell RMC1. The reference cell RMC2 is associated with a plurality of memory cells MC2 through MC2n. The reference cell RMC3 is associated with a plurality of memory cells MC3 through MC3n.

In addition, in FIGS. 2 and 3, reference sign RST0 denotes a first reference cell resetting circuit. The first reference cell resetting circuit RST0 includes: a third MOS transistor T2 whose gate is connected to a reference-cell-reset starting signal line RST and source is connected to the first storage node ST0 of the first reference cell RMC0; and a fourth MOS transistor T3 whose gate is connected to the reference-cell-reset starting signal line RST, source is grounded and drain is connected to the second storage node ST1 of the second reference cell RMC1.

Reference sign RST1 denotes a second reference cell resetting circuit. The second reference cell resetting circuit RST1 includes: a thirteenth MOS transistor T12 whose gate is connected to the reference-cell-reset starting signal line RST and source is connected to the fifth storage node ST4 of the third reference cell RMC2; and a fourteenth MOS transistor T13 whose gate is connected to the reference-cell-reset starting signal line RST, source is grounded and drain is connected to the sixth storage node ST5 of the fourth reference cell RMC3.

Reference sign RFDR0 denotes a first reference cell reset driver. The first reference cell reset driver RFDR0 includes: a fifth MOS transistor T4 whose gate is connected to a second reference-cell-reset-driver starting signal line XRDIN3 and source receives a power-supply potential; a sixth MOS transistor T5 whose gate is connected to a first reference-cell-reset-driver starting signal line XRDIN2 and source is grounded; and a seventh MOS transistor T6 whose gate is connected to a third reference-cell-reset-driver starting signal line RDIN4 and source is grounded. The drains of these three MOS transistors are connected to the source of the third MOS transistor T2 included in the first reference cell resetting circuit RST0.

Reference sign RFDR1 denotes a second reference cell reset driver. The second reference cell reset driver RFDR1 includes: a fifteenth MOS transistor T14 whose gate is connected to the second reference-cell-reset-driver starting signal line XRDIN3 and source receives a power-supply potential; a sixteenth MOS transistor T15 whose gate is connected to the first reference-cell-reset-driver starting signal line XRDIN2 and source is grounded; and a seventeenth MOS transistor T16 whose gate is connected to the third reference-cell-reset-driver starting signal line RDIN4 and source is grounded. The drains of these three MOS transistors are connected to the source of a thirteenth MOS transistor T12 included in the second reference cell resetting circuit RST1.

Reference sign T7 denotes an eighth MOS transistor whose drain and source connect the first reference bit line BL0 and the third reference bit line BL2 to each other and gate is connected to a reference-level-equalization starting signal line REQ. Reference sign T17 denotes an eighteenth MOS transistor whose drain and source connect the fifth reference bit line BL4 and the seventh reference bit line BL6 to each other and gate is connected to the reference-level-equalization starting signal line REQ.

Reference sign SA denotes a sense amplifier for amplifying the potential difference between the first reference bit line BL0 and the second normal bit line BL1, the potential difference between the third reference bit line BL2 and the fourth normal bit line BL3, the potential difference between the fifth reference bit line BL4 and the sixth normal bit line BL5 and the potential difference between the seventh reference bit line BL6 and the eighth normal bit line BL7, when a sense amplifier starting signal SAE is at an H level.

Reference sign PERI1 denotes a second peripheral circuit (a control circuit) connected to the reference word line RWL, the word line WL, the reference cell plate line RCP, the cell plate line CP, the reference-cell-reset starting signal line RST, the reference-level-equalization starting signal line REQ, the first reference-cell-reset-driver starting signal line XRDIN2, the second reference-cell-reset-driver starting signal line XRDIN3, and the third reference-cell-reset-driver starting signal line RDIN4 and the sense amplifier starting signal line SAE. The second peripheral circuit PERI1 controls the reference cells, the reference resetting circuits, the reference cell reset drivers, the memory cells, the sense amplifier SA and the MOS transistors T7 and T17.

Circuit operation of this ferro-electric memory of the first embodiment will be described with reference to the timing chart of FIG. 4 and the diagram of FIG. 7 showing hysteresis characteristics of a ferro-electric constituting the memory cell capacitors of the ferro-electric memory shown in FIG. 7.

In FIG. 7, the abscissa indicates a voltage applied to a ferro-electric capacitor, more specifically, a voltage applied to a plate line relative to a bit-line voltage. The ordinate indicates the amount of charge in the ferro-electric capacitor at the application of the voltage. As shown in FIG. 7, in the ferro-electric capacitor, residual polarization occurs as indicated by points A and G even when a voltage applied between both terminals is zero. A nonvolatile ferro-electric memory for storing data is implemented by utilizing this residual polarization characteristic. When data in a memory cell is "1", a memory cell capacitor is in the state indicated by point A in FIG. 7. When data in the memory cell is "0", the memory cell capacitor is in the state indicated by point G in FIG. 7.

Suppose the first ferro-electric capacitor C0 and the second ferro-electric capacitor C1 in FIG. 2 are included in reference cells, the third ferro-electric capacitor C2 and the fourth ferro-electric capacitor C3 are included in normal memory cells. Then, if data is read out from the third and fourth ferro-electric capacitors C2 and C3 with data "1" written in the first and third ferro-electric capacitors C0 and C2 and data "0" written in the second and fourth ferro-electric capacitors C1 and C3, the word line WL, the cell plate line CP, the reference-level-equalization starting signal REQ, the reference word line RWL, the reference cell plate line RCP, the sense amplifier starting signal SAE, the first reference bit line BL0, the second normal bit line BL1, the third reference bit line BL2, the fourth normal bit line BL3, the reference-cell-reset starting signal RST, the third reference-cell-reset-driver starting signal RDIN4, the first storage node ST0 and the second storage node ST1 are at logic voltage levels "L", and the first reference-cell-reset-driver starting signal XRDIN2 and the second reference-cell-reset-driver starting signal XRDIN3 are at logic voltage levels "H", as an initial state.

First, at timing t01 shown in FIG. 4, the reference-level-equalization starting signal REQ is raised to a logic voltage level "H". At timing t02, the word line WL and the reference word line RWL are raised to logic voltage levels "H". At timing t03, the cell plate line CP and the reference cell plate line RCP are raised to logic voltage levels "H".

In this manner, the first MOS transistor T0, the second MOS transistor T1, the ninth MOS transistor T8 and the tenth MOS transistor T9 in FIG. 2 are turned ON, so that a voltage is applied to the first ferro-electric capacitor C0, the second ferro-electric capacitor C1, the third ferro-electric capacitor C2 and the fourth ferro-electric capacitor C3. In addition, the eighth MOS transistor T7 is turned ON, thereby making the first reference bit line BL0 and the third reference bit line BL2 electrically continuous. At this time, data "1" is written in the third ferro-electric capacitor C2, so that the state indicated by point A changes to the state indicated by point B as shown in FIG. 7, and charge Q1 is read out to the second normal bit line BL1. Data "0" is written in the fourth ferro-electric capacitor C3, so that the state indicated by point G changes to the state indicated by point E as shown in FIG. 7, and charge Q0 is read out to the fourth normal bit line BL3. On the other hand, data "1" is written in the first ferro-electric capacitor C0, so that the state indicated by point A changes to the state indicated by point C as shown in FIG. 7. Data "0" is written in the second ferro-electric capacitor C1, so that the state indicated by point G changes to the state indicated by point F as shown in FIG. 7. Accordingly, charge QR is read out to the first and third reference bit lines BL0 and BL2.

Then, at timing t05 shown in FIG. 4, the reference cell plate line RCP and the cell plate line CP are lowered to logic voltage levels "L". At this time, the third ferro-electric capacitor C2 changes from the state indicated by point B to the state indicated by point J as shown in FIG. 7. The fourth ferro-electric capacitor C3 changes from the state indicated by point E to the state indicated by point G as shown in FIG. 7. The first ferro-electric capacitor C0 changes from the state indicated by point C to the state indicated by point K as shown in FIG. 7. The second ferro-electric capacitor C1 changes from the state indicated by point F to the state indicated by point H as shown in FIG. 7.

Thereafter, at timing t06 shown in FIG. 4, the reference word line RWL is lowered to a logic voltage level "L". Then, the first ferro-electric capacitor C0 changes from the state indicated by point K to the state indicated by point L as shown in FIG. 7 and the second ferro-electric capacitor C1 changes from the state indicated by point H to the state indicated by point P as shown in FIG. 7.

Subsequently, at timing t09 shown in FIG. 4, the sense amplifier starting signal SAE raised to a logic voltage level "H". The sense amplifier SA amplifies a potential difference (potential difference V1 shown in FIG. 7) read out to the first reference bit line BL0 and the second normal bit line BL1 and a potential difference (potential difference V0 shown in FIG. 7) read out to the third reference bit line BL2 and the fourth normal bit line BL3, so that data "1" is read out from the third ferro-electric capacitor C2 and data "0" is read out from the fourth ferro-electric capacitor C3. At this time, the third ferro-electric capacitor C2 changes from the state indicated by point J to the state indicated by point I as shown in FIG. 7. The fourth ferro-electric capacitor C3 remains in the state indicated by point G shown in FIG. 7.

On the other hand, at timing t07 shown in FIG. 4, the reference-level-equalization starting signal REQ is lowered to a logic voltage level "L". At timing t09, the first reference-cell-reset-driver starting signal XRDIN2 is lowered to a logic voltage level "L", the second reference-cell-reset-driver starting signal XRDIN3 is lowered to a logic voltage level "L", and reference-cell-reset starting signal RST is raised to a logic voltage level "H". Then, the first ferro-electric capacitor C0 changes from the state indicated by point L to the state indicated by point I by way of the state indicated by point K as shown in FIG. 7. The second ferro-electric capacitor C1 remains in the state indicted by point P shown in FIG. 7.

At timing t10 shown in FIG. 4, the cell plate line CP and the reference cell plate line RCP are raised to logic voltage levels "H". Then, the first and third ferro-electric capacitors C0 and C2 change from the state indicated by point I to the state indicated by point A as shown in FIG. 7. The second and fourth ferro-electric capacitors C1 and C3 change from the state indicated by point G to the state indicated by point D as shown in FIG. 7.

Thereafter, at timing t12 shown in FIG. 4, the reference cell plate line RCP and the cell plate line CP are lowered to logic voltage levels "L". Then, the first and third ferro-electric capacitors C0 and C2 change from the state indicated by point A to the state indicated by point I as shown in FIG. 7. The second and fourth ferro-electric capacitors C1 and C3 change from the state indicated by point D to the state indicated by point G as shown in FIG. 7.

Then, at timing t14 shown in FIG. 4, the sense amplifier starting signal SAE is lowered to a logic voltage level "L". Then, the third ferro-electric capacitor C2 changes from the state indicated by point I to the state indicated by point A as shown in FIG. 7. The fourth ferro-electric capacitor C3 remains in the state indicated by point G shown in FIG. 7.

Subsequently, at timing t13 shown in FIG. 4, the second reference-cell-reset-driver starting signal XRDIN3 is raised to a logic voltage level "H" so that the fifth MOS transistor T4 is turned OFF. The third reference-cell-reset-driver starting signal RDIN4 is raised to a logic voltage level "H" so that the seventh MOS transistor T6 is turned ON. At timing t14 shown in FIG. 4, the first reference-cell-reset-driver starting signal XRDIN2 is raised to a logic voltage level "H" so that the sixth MOS transistor T5 is turned ON. The third reference-cell-reset-driver starting signal RDIN4 is lowered to a logic voltage level "L" so that the seventh MOS transistor T6 is turned OFF. Then, the first ferro-electric capacitor C0 changes from the state indicated by point I to the state indicated by point A as shown in FIG. 7 and the second ferro-electric capacitor C1 remains in the state indicated by point G shown in FIG. 7.

Lastly, at timing t17 shown in FIG. 4, the word line WL and the reference-cell-reset starting signal RST are lowered to logic voltage levels "L". At this time, the first and third ferro-electric capacitors C0 and C2 are in the state indicated by point A shown in FIG. 7, and the second and fourth ferro-electric capacitors C1 and C3 are in the state indicated by point G shown in FIG. 7.

In the ferro-electric memory of the first embodiment, the period (period (5) in FIG. 4) in which "H" data is written in a reference cell is shorter than the period (period (2) in FIG. 4) in which "H" data is written in a normal cell. Accordingly, total stress applied to reference cells is reduced, and in addition, the period required to rewrite "H" data in the reference cells is reduced.

Specifically, in a ferro-electric memory including reference cells, if one reference cell RMC0 is associated with a plurality of normal cells (e.g., MC0 through MC0$n$), the reference cell RMC0 is accessed concurrently with every access to the normal cells MC0 through MC0$n$. Accordingly, there can occur a situation in which stress is applied to the reference cell RMC0 N times (where N is the number of the normal cells MC0 through MC0$n$) so that the reference cell RMC0 is subjected to stress N times as high as that on a normal cell. However, in this embodiment, write access to a reference cell is performed in a short period, so that stress applied to this reference cell RMC0 is lower than that applied to each of the normal cells MC0 through MC0$n$ accordingly. Consequently, even if the reference cell RMC0 is repeatedly accessed, total stress applied to this reference cell RMC0 is effectively reduced, so that reliability of various characteristics such as a characteristic in rewriting data in the reference cell RMC0 is enhanced.

Embodiment 2

Now, a second embodiment of the present invention will be described with reference to drawings.

A circuit configuration according to this embodiment is different from that of the first embodiment only in control of a peripheral circuit. Therefore, in this embodiment, the diagram of FIG. 2 showing the circuit configuration used for the description of the first embodiment will be used, the second peripheral circuit PERI1 in FIG. 2 will be referred to as a third peripheral circuit PERI2 (a control circuit), not shown, FIG. 5 will be used to show operation timings, and FIG. 7 will be used as a diagram showing hysteresis characteristics of a ferro-electric used in memory cell capacitors in a ferro-electric memory.

The circuit configuration of this embodiment is the same as that of the first embodiment, and thus operation thereof will be described with the description thereof omitted.

Figure 5:
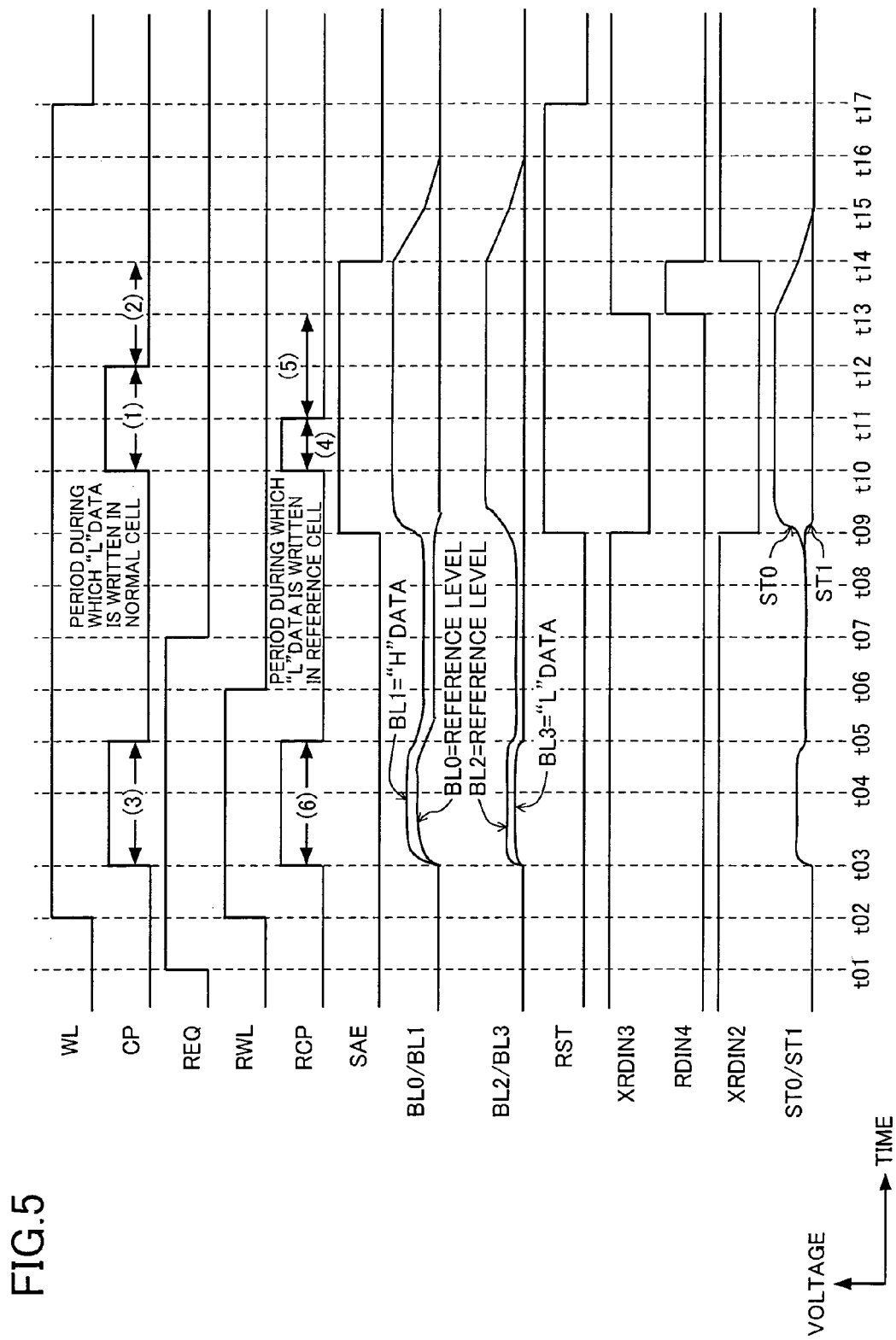
FIG. 5 is a timing chart showing operation of a ferro-electric memory according to a second embodiment of the present invention.

First, at timing t01 shown in FIG. 5, the reference-level-equalization starting signal REQ is raised to a logic voltage level "H". At timing t02, the word line WL and the reference word line RWL are raised to logic voltage levels "H". At timing t03, the cell plate line CP and the reference cell plate line RCP are raised to voltage levels "H".

In this manner, the first MOS transistor T0, the second MOS transistor T1, the ninth MOS transistor T8 and the tenth MOS transistor T9 in FIG. 2 are turned ON, so that a voltage is applied to the first ferro-electric capacitor C0, the second ferro-electric capacitor C1, the third ferro-electric capacitor C2 and the fourth ferro-electric capacitor C3. In addition, the eighth MOS transistor T7 is turned ON, thereby making the first reference bit line BL0 and the third reference bit line BL2 electrically continuous. At this time, data "1" is written in the third ferro-electric capacitor C2, so that the state indicated by point A changes to the state indicated by point B as shown in FIG. 7, and charge Q1 is read out to the second normal bit line BL1. Data "0" is written in the fourth ferro-electric capacitor C3, so that the state indicated by point G changes to the state indicated by point E as shown in FIG. 7, and charge Q0 is read out to the fourth normal bit line BL3. On the other hand, data "1" is written in the first ferro-electric capacitor C0, so that the state indicated by point A changes to the state indicated by point C as shown in FIG. 7. Data "0" is written in the second ferro-electric capacitor C1, so that the state indicated by point G changes to the state indicated by point F as shown in FIG. 7. Accordingly, charge QR is read out to the first and third reference bit lines BL0 and BL2.

Then, at timing t05 shown in FIG. 5, the reference cell plate line RCP and the cell plate line CP are lowered to logic voltage levels "L". At this time, the third ferro-electric capacitor C2 changes from the state indicated by point B to the state indicated by point J as shown in FIG. 7. The fourth ferro-electric capacitor C3 changes from the state indicated by point E to the state indicated by point G as shown in FIG. 7. The first ferro-electric capacitor C0 changes from the state indicated by point C to the state indicated by point K as shown in FIG. 7. The second ferro-electric capacitor C1 changes from the state indicated by point F to the state indicated by point H as shown in FIG. 7.

Thereafter, at timing t06 shown in FIG. 5, the reference word line RWL is lowered to a logic voltage level "L". Then, the first ferro-electric capacitor C0 changes from the state indicated by point K to the state indicated by point L as shown in FIG. 7 and the second ferro-electric capacitor C1 changes from the state indicated by point H to the state indicated by point P as shown in FIG. 7.

Subsequently, at timing t09 shown in FIG. 5, the sense amplifier starting signal SAE is raised to a logic voltage level "H". The sense amplifier SA amplifies a potential difference (potential difference V1 shown in FIG. 7) read out to the first reference bit line BL0 and the second normal bit line BL1 and a potential difference (potential difference V0 shown in FIG. 7) read out to the third reference bit line BL2 and the fourth normal bit line BL3, so that data "1" is read out from the third ferro-electric capacitor C2 and data "0" is read out from the fourth ferro-electric capacitor C3. At this time, the third ferro-electric capacitor C2 changes from the state indicated by point J to the state indicated by point I as shown in FIG. 7. The fourth ferro-electric capacitor C3 remains in the state indicated by point G shown in FIG. 7.

On the other hand, at timing t07 shown in FIG. 5, the reference-level-equalization starting signal REQ is lowered to a logic voltage level "L". At timing t09, the first reference-cell-reset-driver starting signal XRDIN2 is lowered to a logic voltage level "L", the second reference-cell-reset-driver starting signal XRDIN3 is lowered to a logic voltage level "L", and reference-cell-reset starting signal RST is raised to a logic voltage level "H". Then, the first ferro-electric capacitor C0 changes from the state indicated by point L to the state indicated by point I by way of the state indicated by point K as shown in FIG. 7. The second ferro-electric capacitor C1 remains in the state indicted by point P shown in FIG. 7.

At timing t10 shown in FIG. 5, the cell plate line CP and the reference cell plate line RCP are raised to logic voltage levels "H". Then, the first and third ferro-electric capacitors C0 and C2 change from the state indicated by point I to the state indicated by point A as shown in FIG. 7. The second and fourth ferro-electric capacitors C1 and C3 change from the state indicated by point G to the state indicated by point D as shown in FIG. 7.

Thereafter, at timing t11 shown in FIG. 5, the reference cell plate line RCP is lowered to a logic voltage level "L" and, at timing t12, the cell plate line CP is lowered to a logic voltage level "L". Then, the first and third ferro-electric capacitors C0 and C2 change from the state indicated by point A to the state indicated by point I as shown in FIG. 7. The second and fourth ferro-electric capacitors C1 and C3 change from the state indicated by point D to the state indicated by point G as shown in FIG. 7.

Then, at timing t14 shown in FIG. 5, the sense amplifier starting signal SAE is lowered to a logic voltage level "L". Then, the third ferro-electric capacitor C2 changes from the state indicated by point I to the state indicated by point A as shown in FIG. 7. The fourth ferro-electric capacitor C3 remains in the state indicated by point G shown in FIG. 7.

At timing t13 shown in FIG. 5, the second reference-cell-reset-driver starting signal XRDIN3 is raised to a logic voltage level "H" so that the fifth MOS transistor T4 is turned OFF. The third reference-cell-reset-driver starting signal RDIN4 is raised to a logic voltage level "H" so that the seventh MOS transistor T6 is turned ON. Then, at timing t14 shown in FIG. 5, the first reference-cell-reset-driver starting signal XRDIN2 is raised to a logic voltage level "H" so that the sixth MOS transistor T5 is turned ON. The third reference-cell-reset-driver starting signal RDIN4 is lowered to a logic voltage level "L" so that the seventh MOS transistor T6 is turned OFF. Then, the first ferro-electric capacitor C0 changes from the state indicated by point I to the state indicated by point A as shown in FIG. 7 and the second ferro-electric capacitor C1 remains in the state indicated by point G shown in FIG. 7.

Lastly, at timing t17 shown in FIG. 5, the word line WL and the reference-cell-reset starting signal RST are lowered to logic voltage levels "L". At this time, the first and third ferro-electric capacitors C0 and C2 are in the state indicated by point A shown in FIG. 7, and the second and fourth ferro-electric capacitors C1 and C3 are in the state indicated by point G shown in FIG. 7. "L" data is written in a reference cell by changing the state thereof from point P to point G by way of point D. "H" data is written in the reference cell by changing the state thereof from point L to point A by way of point I. In this case, the loci of these points forming hysteresis loops represent periods necessary for writing. Since the locus indicating the period in which "L" data is written in the reference cell is shorter than that indicating the period in which "H" data is written in the reference cell, the period (period (4) in FIG. 5) for writing "L" data in the reference cell can be set shorter than the period (period (5) in FIG. 5) for writing "H" data in the reference cell.

In the ferro-electric memory of the second embodiment, the period (period (4) in FIG. 5) in which "L" data is written in a reference cell is set shorter than the period (period (1) in FIG. 5) in which "L" data is written in a normal cell. Accordingly, stress applied to reference cells is reduced, and in addition, the period (period (4) in FIG. 5) in which "L" data is written in a reference cell is shorter than the period (period (5) in FIG. 5) in which "H" data is written in the reference cell. As a result, stress applied to reference cells is reduced, and the period required to rewrite data in the reference cells is reduced.

Specifically, in a ferro-electric memory including reference cells, if one reference cell is associated with a plurality of normal cells, the reference cell is accessed concurrently with every access to the normal cells. Accordingly, there can occur a situation in which stress is applied to the reference cell N times (where N is the number of the normal cells) so that the reference cell is subjected to stress N times as high as that on a normal cell. However, in this embodiment, write access to a reference cell is performed in a short period, so that stress applied to this reference cell at each access is lower than that applied to each of the normal cells accordingly. Consequently, even if the reference cell is repeatedly accessed, total stress applied to this reference cell is effectively reduced, so that reliability of various characteristics such as a characteristic in rewriting data in the reference cell is enhanced.

Embodiment 3

Now, a third embodiment of the present invention will be described with reference to drawings.

A circuit configuration according to this embodiment is different from that of the first embodiment only in control of a peripheral circuit. Therefore, in this embodiment, the diagram of FIG. 2 showing the circuit configuration used for the description of the first embodiment will be used, the second peripheral circuit PERI1 in FIG. 2 will be referred to as a fourth peripheral circuit PERI3 (a control circuit), not shown, FIG. 6 will be used to show operation timings, and FIG. 7 will be used as a diagram showing hysteresis characteristics of a ferro-electric used in memory cell capacitors in a ferro-electric memory.

The circuit configuration of this embodiment is the same as that of the first embodiment, and thus operation thereof will be described with the description thereof omitted.

Figure 6:
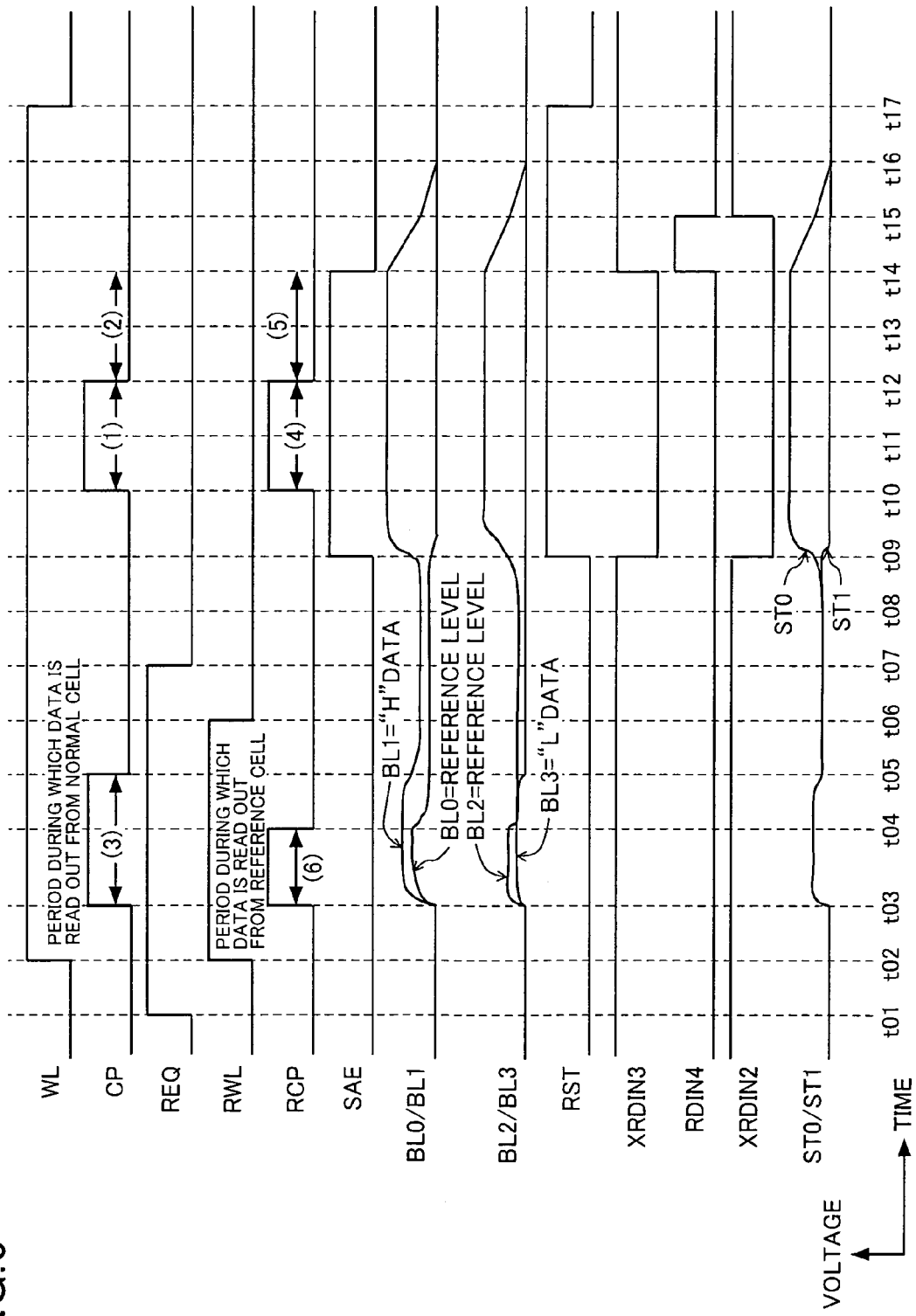
FIG. 6 is a timing chart showing operation of a ferro-electric memory according to a third embodiment of the present invention.

First, at timing t01 shown in FIG. 6, the reference-level-equalization starting signal REQ is raised to a logic voltage level "H". At timing t02, the word line WL and the reference word line RWL are raised to logic voltage levels "H". At timing t03, the cell plate line CP and the reference cell plate line RCP are raised to logic voltage levels "H".

In this manner, the first MOS transistor T0, the second MOS transistor T1, the ninth MOS transistor T8 and the tenth MOS transistor T9 in FIG. 2 are turned ON, so that a voltage is applied to the first ferro-electric capacitor C0, the second ferro-electric capacitor C1, the third ferro-electric capacitor C2 and the fourth ferro-electric capacitor C3. In addition, the eighth MOS transistor T7 is turned ON, thereby making the first reference bit line BL0 and the third reference bit line BL2 electrically continuous. At this time, data "1" is written in the third ferro-electric capacitor C2, so that the state indicated by point A changes to the state indicated by point B as shown in FIG. 7, and charge Q1 is read out to the second normal bit line BL1. Data "0" is written in the fourth ferro-electric capacitor C3, so that the state indicated by point G changes to the state indicated by point E as shown in FIG. 7, and charge Q0 is read out to the fourth normal bit line BL3. On the other hand, data "1" is written in the first ferro-electric capacitor C0, so that the state indicated by point A changes to the state indicated by point C as shown in FIG. 7. Data "0" is written in the second ferro-electric capacitor C1, so that the state indicated by point G changes to the state indicated by point F as shown in FIG. 7.

Accordingly, charge QR is read out to the first and third reference bit lines BL0 and BL2.

Then, at timing t04 shown in FIG. 6, the reference cell plate line RCP is lowered to a logic voltage level "L", and at timing t05 the cell plate line CP is lowered to a logic voltage level "L". At this time, the third ferro-electric capacitor C2 changes from the state indicated by point B to the state indicated by point J as shown in FIG. 7. The fourth ferro-electric capacitor C3 changes from the state indicated by point E to the state indicated by point G as shown in FIG. 7.

The first ferro-electric capacitor C0 changes from the state indicated by point C to the state indicated by point K shown in FIG. 7. The second ferro-electric capacitor C1 changes from the state indicated by point F to the state indicated by point H shown in FIG. 7. At this time, the positions of points K and H are determined in accordance with a capacitance value (hereinafter, referred to as Csh) corresponding to the gradient of a tangent at point C and a capacitance value (hereinafter, referred to as Csl) corresponding to the gradient of a tangent at point F. In other words, V1 and V0 shown in FIG. 7 are determined in accordance with these capacitance values. In the hysteresis loop in FIG. 7, the relationship of Csh>Csl is established. Therefore, if the period (period (6) in FIG. 6) in which data is read out from reference cells is equal to the period (period (3) in FIG. 6) in which data is read out from normal cells, the relationship of V1<V0 is established. In view of this, the time required to read data from a reference cell is set shorter than that required to read data from a normal cell. Specifically, attention is given to "H" data which needs longer read period than "L" data, and operation of reading "H" data from a reference cell is controlled to a smaller extent than operation of reading "H" data from a normal cell. In this manner, a relationship closer to V1=V0 is obtained.

Thereafter, at timing t06 shown in FIG. 6, the reference word line RWL is lowered to a logic voltage level "L". Then, the first ferro-electric capacitor C0 changes from the state indicated by point K to the state indicated by point L as shown in FIG. 7 and the second ferro-electric capacitor C1 changes from the state indicated by point H to the state indicated by point P as shown in FIG. 7.

Subsequently, at timing t09 shown in FIG. 6, the sense amplifier starting signal SAE is raised to a logic voltage level "H". The sense amplifier SA amplifies a potential difference (potential difference V1 shown in FIG. 7) read out to the first reference bit line BL0 and the second normal bit line BL1 and a potential difference (potential difference V0 shown in FIG. 7) read out to the third reference bit line BL2 and the fourth normal bit line BL3, so that data "1" is read out from the third ferro-electric capacitor C2 and data "0" is read out from the fourth ferro-electric capacitor C3. At this time, the third ferro-electric capacitor C2 changes from the state indicated by point J to the state indicated by point I as shown in FIG. 7. The fourth ferro-electric capacitor C3 remains in the state indicated by point G shown in FIG. 7.

On the other hand, at timing t07 shown in FIG. 6, the reference-level-equalization starting signal REQ is lowered to a logic voltage level "L". At timing t09, the first reference-cell-reset-driver starting signal XRDIN2 is lowered to a logic voltage level "L", the second reference-cell-reset-driver starting signal XRDIN3 is lowered to a logic voltage level "L", and reference-cell-reset starting signal RST is raised to a logic voltage level "H". Then, the first ferro-electric capacitor C0 changes from the state indicated by point L to the state indicated by point I by way of the state indicated by point K as shown in FIG. 7. The second ferro-electric capacitor C1 remains in the state indicted by point P shown in FIG. 7.

At timing t10 shown in FIG. 6, the cell plate line CP and the reference cell plate line RCP are raised to logic voltage levels "H". Then, the first and third ferro-electric capacitors C0 and C2 change from the state indicated by point I to the state indicated by point A as shown in FIG. 7. The second and fourth ferro-electric capacitors C1 and C3 change from the state indicated by point G to the state indicated by point D as shown in FIG. 7.

Thereafter, at timing t12 shown in FIG. 6, the reference cell plate line RCP and the cell plate line CP are lowered to logic voltage levels "L". Then, the first and third ferro-electric capacitors C0 and C2 change from the state indicated by point A to the state indicated by point I as shown in FIG. 7. The second and fourth ferro-electric capacitors C1 and C3 change from the state indicated by point D to the state indicated by point G shown in FIG. 7.

Then, at timing t14 shown in FIG. 6, the sense amplifier starting signal SAE is lowered to a logic voltage level "L". Then, the third ferro-electric capacitor C2 changes from the state indicated by point I to the state indicated by point A as shown in FIG. 7. The fourth ferro-electric capacitor C3 remains in the state indicated by point G shown in FIG. 7.

At timing t14 shown in FIG. 6, the second reference-cell-reset-driver starting signal XRDIN3 is raised to a logic voltage level "H" so that the fifth MOS transistor T4 is turned OFF. The third reference-cell-reset-driver starting signal RDIN4 is raised to a logic voltage level "H" so that the seventh MOS transistor T6 is turned ON. Then, at timing t15 shown in FIG. 6, the first reference-cell-reset-driver starting signal XRDIN2 is raised to a logic voltage level "H" so that the sixth MOS transistor T5 is turned ON. The third reference-cell-reset-driver starting signal RDIN4 is lowered to a logic voltage level "L" so that the seventh MOS transistor T6 is turned OFF. Then, the first ferro-electric capacitor C0 changes from the state indicated by point I to the state indicated by point A as shown in FIG. 7 and the second ferro-electric capacitor C1 remains in the state indicated by point G shown in FIG. 7.

Lastly, at timing t17 shown in FIG. 6, the word line WL and the reference-cell-reset starting signal RST are lowered to logic voltage levels "L". At this time, the first and third ferro-electric capacitors C0 and C2 are in the state indicated by point A shown in FIG. 7, and the second and fourth ferro-electric capacitors C1 and C3 are in the state indicated by point G shown in FIG. 7.

In the ferro-electric memory of the third embodiment, the period (period (6) in FIG. 6) in which data is read out from a reference cell is shorter than the period (period (3) in FIG. 6) in which data is read out from a normal cell. Accordingly, stress applied to reference cells is reduced.

Specifically, in a ferro-electric memory including reference cells, if one reference cell is associated with a plurality of normal cells, the reference cell is accessed concurrently with every access to the normal cells. Accordingly, there can occur a situation in which stress is applied to the reference cell N times (where N is the number of the normal cells) so that the reference cell is subjected to stress N times as high as that on a normal cell. However, in this embodiment, read access to a reference cell is performed in a short period, so that stress applied to this reference cell at each access is lower than that applied to each of the normal cells accordingly. Consequently, even if the reference cell is repeatedly accessed, total stress applied to this reference cell is effectively reduced, so that reliability of various characteristics such as a characteristic in reading data from the reference cell is enhanced.

In addition, the period in which data is read out from a reference cell is optimized, so that a reference level almost at the middle of "H" data and "L" data is obtained. Accordingly, power consumption is further reduced and data retention is enhanced.

In the first through third embodiments, the period for writing or reading "H" data and "L" data in a reference cell or the period for reading data from the reference cell is longer than a period necessary for the potential difference between a normal bit line and a reference bit line to be sensed by the sense amplifier when data is read out from a normal cell and the reference cell.

Figure 1:
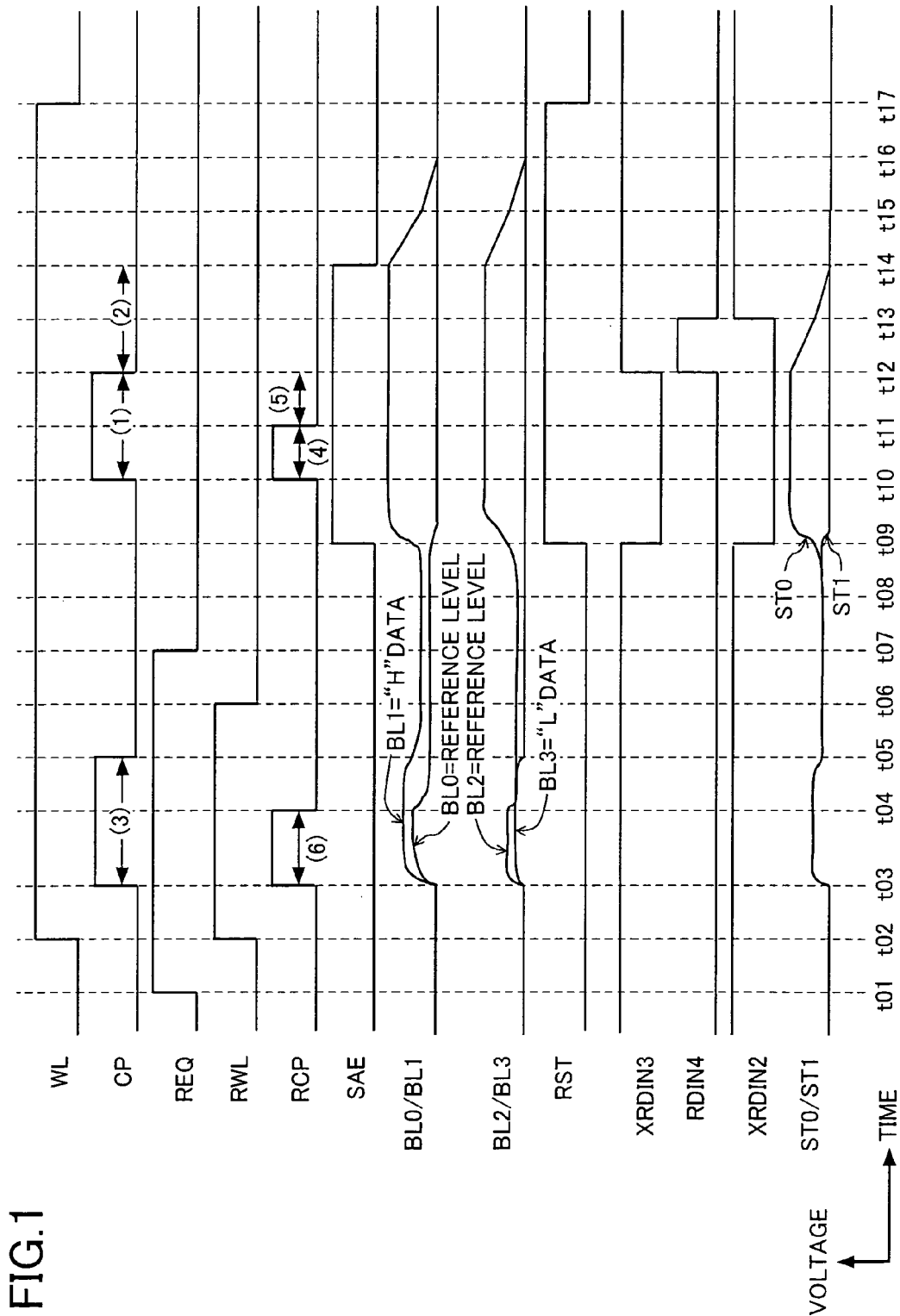
FIG. 1 is a timing chart showing operation of a ferro-electric memory as a combination of first through third embodiments of the present invention.

The present invention is also applicable to a combination of the first through third embodiments, i.e., to operation timings shown in FIG. 1 in which the period (period (4) in FIG. 4) in which data "L" is written in a reference cell is shorter than the period (period (1) in FIG. 1) in which "L" data is written in a normal cell, the period (period (5) in FIG. 1) in which "H" data is written in the reference cell is shorter than the period (period (2) in FIG. 1) in which "H" data is written in a normal cell, and the period (period (6) in FIG. 1) in which data is read out from the reference cell is shorter than the period (period (3) in FIG. 1) in which data is read out from a normal cell. According to the present invention, the period (period (5) in FIG. 4) in which "H" data is written in a reference cell may, of course, be set shorter than the period (period (4) in FIG. 4) in which "L" data is written in the reference cell, as shown in FIG. 4. In contrast, as shown in FIG. 5, the period (period (4) in FIG. 5) in which "L" data is written in a reference cell may, of course, be set shorter than the period (period (5) in FIG. 5) in which "H" data is written in the reference cell.

What is claimed is:

1. A ferro-electric memory comprising:
at least one reference cell;
a plurality of normal cells associated with the reference cell; and
a control circuit for controlling access to the normal cells and the reference cell,
wherein with respect to at least one pair out of three pairs of processing periods including a pair of a period in which "H" data is written in the reference cell and a period in which "H" data is written in each of the normal cells, a pair of a period in which "L" data is written in the reference cell and a period in which "L" data is written in each of the normal cells, and a pair of a period in which data is read out from the reference cell and a period in which data is read out from each of the normal cells, the control circuit sets a processing period for the reference cell to be shorter than a processing period for each of the normal cells.

2. The ferro-electric memory of claim 1 including:
a normal bit line through which data is read out from one of the normal cells;
a reference bit line through which data is read out from the reference cell; and
a sense amplifier for amplifying a potential difference between the normal bit line and the reference bit line,
wherein the control circuit sets the period in which "H" data or "L" data is written in the reference cell to be longer than a period necessary for the potential difference between the normal bit line and the reference bit line to be sensed by the sense amplifier when "H" data or "L" data is read out from the normal cells and the reference cell.

3. The ferro-electric memory of claim 1 including:

a normal bit line through which data is read out from one of the normal cells;

a reference bit line through which data is read out from the reference cell; and a sense amplifier for amplifying a potential difference between the normal bit line and the reference bit line, wherein the control circuit sets the period in which data is read out from the reference cell to be longer than a period necessary for the potential difference between the normal bit line and the reference bit line to be sensed by the sense amplifier when "H" data or "L" data is read out from the normal cells and the reference cell.

4. The ferro-electric memory of claim 1, wherein the control circuit sets the period in which "H" data is written in the reference cell to be shorter than the period in which "H" data is written in each of the normal cells.

5. The ferro-electric memory of claim 4, wherein the control circuit sets the period in which "H" data is written in the reference cell to be shorter than the period in which "L" data is written in the reference cell.

6. The ferro-electric memory of claim 1, wherein the control circuit sets the period in which "L" data is written in the reference cell to be shorter than the period in which "L" data is written in each of the normal cells.

7. The ferro-electric memory of claim 6, wherein the control circuit sets the period in which "L" data is written in the reference cell to be shorter than the period in which "H" data is written in the reference cell.

8. The ferro-electric memory of claim 1, wherein the control circuit sets the period in which data is read out from the reference cell to be shorter than the period in which data is read out from each of the normal cells.

9. The ferro-electric memory of claim 8 including:

a normal bit line through which data is read out from one of the normal cells;

a reference bit line through which data is read out from the reference cell; and a sense amplifier for amplifying a potential difference between the normal bit line and the reference bit line, wherein the control circuit sets the period in which data is read out from the reference cell to be longer than a period necessary for the potential difference between the normal bit line and the reference bit line to be sensed by the sense amplifier when "H" data or "L" data is read out from the normal cells and the reference cell.

* * * * *